United States Patent
Baggen et al.

(12) 
(10) Patent No.: US 6,574,247 B1
(45) Date of Patent: Jun. 3, 2003

(54) TRANSMISSION SYSTEM FOR TRANSMITTING A MAIN SIGNAL AND AN AUXILIARY SIGNAL

(75) Inventors: Constant P. M. J. Baggen, Eindhoven (NL); Arie G. C. Koppelaar, Eindhoven (NL); Ewa B. Hekstra, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/316,994

(22) Filed: May 24, 1999

(30) Foreign Application Priority Data

May 26, 1998 (EP) .............................. 98201733

(51) Int. Cl.$^7$ ................................. H04J 3/12
(52) U.S. Cl. .................. 370/528; 370/510; 370/473; 370/545
(58) Field of Search .................. 370/347, 332, 370/252, 468, 472, 522, 465, 337, 311, 328, 253, 331, 442, 528, 510, 545, 473, 523; 455/522, 69, 553; 375/341, 250, 222, 225

(56) References Cited

U.S. PATENT DOCUMENTS

| | | | |
|---|---|---|---|
| 5,671,255 A | * 9/1997 | Wang et al. | 375/341 |
| 5,722,051 A | 2/1998 | Agrawal et al. | 455/69 |
| 5,768,296 A | 6/1998 | Langer et al. | 371/37.11 |
| 5,982,766 A | * 11/1999 | Nystrom et al. | 370/347 |
| 6,134,220 A | * 10/2000 | Le Strat et al. | 370/252 |
| 6,292,476 B1 | * 9/2001 | Zehavi et al. | 370/335 |

OTHER PUBLICATIONS

Patent Abstract of Japan: Publication No.: JP9224018 A, Date: Aug. 26, 1997.

Patent Abstract of Japan: Publication No.: JP5175915 A, Date: Jul. 13, 1993.

* cited by examiner

*Primary Examiner*—Vivian Chin
*Assistant Examiner*—John J Lee
(74) *Attorney, Agent, or Firm*—Dicran Halajian

(57) ABSTRACT

In a transmission system with a transmitter coupled to a receiver a main signal encoded according to a coding property is transmitted together with an auxiliary signal (AUX). In order to transmit the auxiliary signal without needing additional space in the transmission frame, the auxiliary signal is transmitted by changing the coding property according to a predetermined sequence. This is done by means of the sequencer. In the receiver, the decoding of the predetermined sequence is performed by a decoder.

20 Claims, 2 Drawing Sheets

TRANSMISSION SYSTEM FOR TRANSMITTING A MAIN SIGNAL AND AN AUXILIARY SIGNAL

FIELD OF THE INVENTION

The present invention relates to a transmission system comprising a transmitter coupled via a transmission channel to a receiver, said transmitter being arranged for transmitting a main signal and an auxiliary signal to a receiver, which is arranged for receiving the main signal and the auxiliary signal.

BACKGROUND OF THE INVENTION

The present invention also relates to a transmitter and a receiver for use in such a transmission system. The invention further relates to a transmission method, and a signal.

In transmission systems it is often desired to transmit in addition to a main signal an auxiliary signal. The main signal can e.g. be a speech signal to be transmitted via a radio link of a mobile telephone system. The auxiliary signal can be e.g. a control signal for requesting a reconfiguration of a the receiver to adapt it to a change of the signal it should receive.

It is possible to include a special field in the transmission frame for such auxiliary signal, but this inclusion of a special field in the transmission frame is very inefficient if the auxiliary signal is rarely used. It is also possible to use a frame structure which is changed when the auxiliary signal has to be transmitted. The use a variable frame structure results in a substantial increase of the complexity of the transmission systems.

SUMMARY OF THE INVENTION

An object of the present invention is to provide a transmission system according to the preamble in which the above mentioned inefficiency and added complexity are avoided.

To achieve said objective, the transmission system according to the invention is characterized in that the transmitter comprises an encoder for encoding the main signal in a way described by a coding property, in that the receiver comprises a decoder for decoding the main signal in a way described by the coding property, in that the transmitter comprises coding property sequencing means for changing the coding property according to a predetermined sequence dependent on the auxiliary signal, and in that the receiver comprises a sequence detector for detecting said predetermined sequence in the coding property.

In the transmission system according to the invention use is made of the fact that the main signal is often encoded. In general the main signal will be encoded according to a source coding scheme in order to reduce its bitrate, and/or to a channel encoding scheme to enable reliable transmission of the main signal over the transmission channel. The source coding scheme can involve the use of CELP coding for a speech signal, and the source coding can involve the use of error correcting codes such as a convolutional coder or a Reed-Solomon block code. The coding property can be the output bitrate of a speech encoder, or the rate of a convolutional encoder. In some transmission systems, the coding property can be changed on the fly to respond to a change of the capacity of the transmission channel. This capacity of the transmission channel can change due to a increased or decreased signal strength and/or interference received from a radio link, or due to more or less congestion of a transmission network such as the Internet.

By changing the coding property by purpose according to a predetermined sequence, it is possible to transmit the auxiliary signal to the receiver without reserving extra space in the frame structure or having to use a varying frame structure.

An embodiment of the present invention is characterized in that the transmission system comprises transmission quality determining means for determining a transmission quality of the transmission channel, and adaptation means for adapting the coding property in dependence on the transmission quality, and in that the coding property sequencing means are arranged for changing the coding property only to values corresponding to a lower transmission quality than the transmission quality determined by the transmission quality determining means.

According to this measure, it is prevented that due to the actions of the coding property sequencing means the coding property is chosen in such a way that reliable transmission is not possible anymore. This could happen when the coding property sequencing means switch to a coding property suitable only for a transmission quality better than the present transmission quality.

BRIEF DESCRIPTION OF THE DRAWINGS

The present invention will now be explained with reference to the drawing figures.

DETAILED DESCRIPTION OF THE INVENTION

Figure 1:
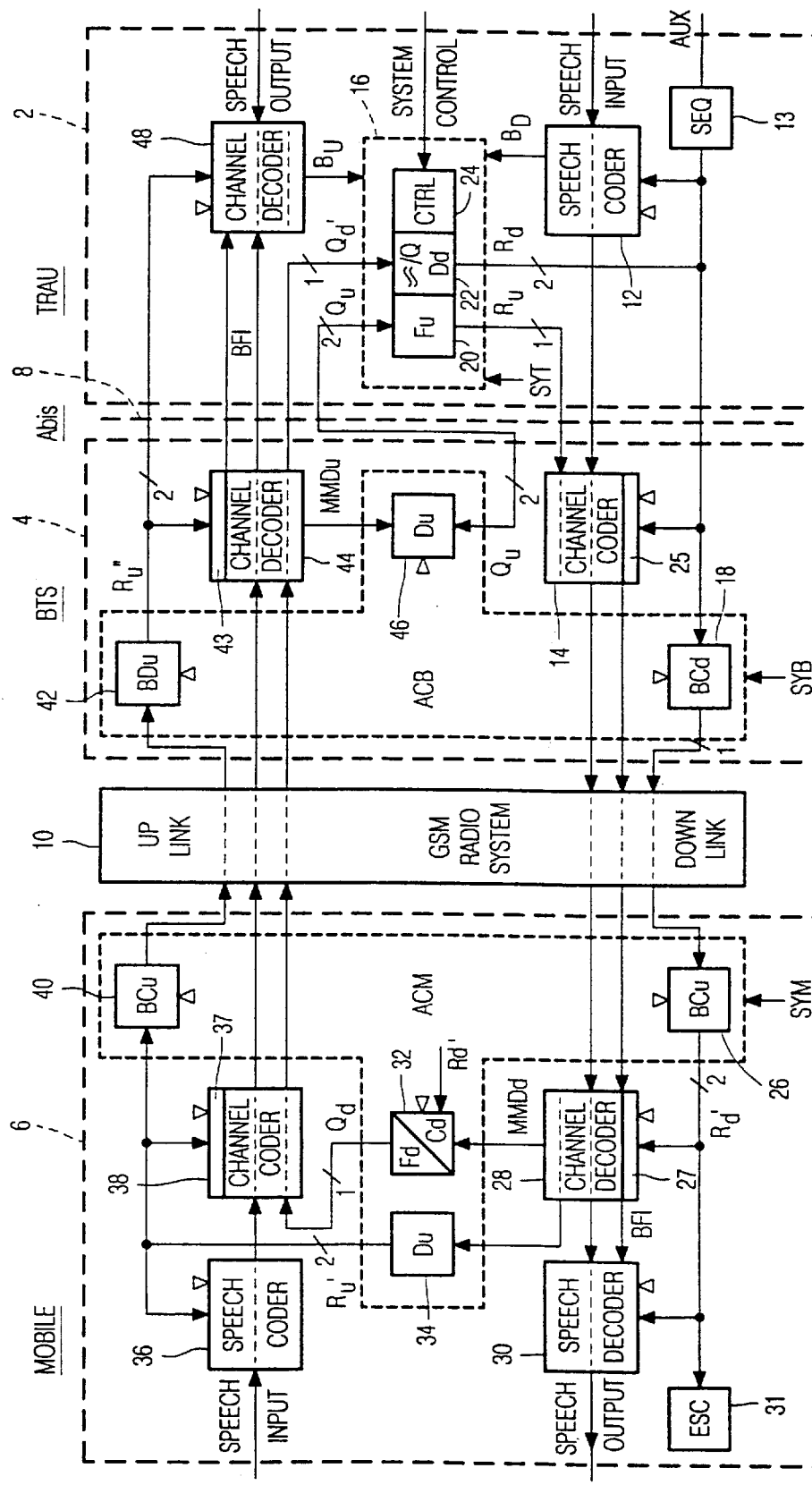
FIG. 1 shows a transmission system according to the invention.

The transmission system according to FIG. 1, comprises three important elements being the TRAU (Transcoder and Rate Adapter Unit) 2, the BTS (Base Transceiver Station) 4 and the Mobile Station 6. The TRAU 2 is coupled to the BTS 4 via the A-bis interface 8. The BTS 4 is coupled to the Mobile Unit 6 via an Air Interface 10.

A main signal being here a speech signal to be transmitted to the Mobile Unit 6, is applied to a speech encoder 12. A first output of the speech encoder 12 carrying an encoded speech signal, also referred to as source symbols, is coupled to a channel encoder 14 via the A-bis interface 8. A second output of the speech encoder 12, carrying a background noise level indicator BD is coupled to an input of a system controller 16. A first output of the system controller 16 carrying a coding property, being here a downlink rate assignment signal RD is coupled to the speech encoder 12 and, via the A-bis interface, to coding property setting means 25 in the channel encoder 14 and to a further channel encoder being here a block coder 18. A second output of the system controller 16 carrying an uplink rate assignment signal RU is coupled to a second input of the channel encoder 14. The two-bit rate assignment signal RU is transmitted bit by bit over two subsequent frames. The rate assignment signals RD and RU constitute a request-to operate the downlink and the uplink transmission system on a coding property represented by RD and RU respectively.

It is observed that the value of $R_D$ transmitted to the mobile station 6 can be overruled by the coding property sequencing means 13 which can force a predetermined sequence of coding properties, as represented by the rate assignment signal $R_D$, onto the block encoder 18 the channel encoder 14 and the speech encoder 13. This predetermined sequence can be used for conveying additional information to the mobile station 6, without needing additional space in the transmission frame. It is possible that more than one predetermined sequence of coding properties is used. Each of the predetermined sequences of coding properties corresponds to a different auxiliary signal value.

The system controller 16 receives from the A-bis interface quality measures $Q_U$ and $Q_D$ indicating the quality of the air interface 10 (radio channel) for the uplink and the downlink. The quality measure $Q_U$ is compared with a plurality of threshold levels, and the result of this comparison is used by the system controller 16 to divide the available channel capacity between the speech encoder 36 and the channel encoder 38 of the uplink. The signal $Q_D$ is filtered by low pass filter 22 and is subsequently compared with a plurality of threshold values. The result of the comparison is used to divide the available channel capacity between the speech encoder 12 and the channel encoder 14. For the uplink and the downlink four different combinations of the division of the channel capacity between the speech encoder 12 and the channel encoder 14 are possible. These possibilities are presented in the table below.

TABLE 1

| $R_x$ | $R_{SPEECH}$(kbit/s) | $R_{CHANNEL}$ | $R_{TOTAL}$(kbit/s) |
|---|---|---|---|
| 0 | 5.5 | 1/4 | 22.8 |
| 1 | 8.1 | 3/8 | 22.8 |
| 2 | 9.3 | 3/7 | 22.8 |
| 3 | 11.1 | 1/2 | 22.8 |
| 0 | 5.5 | 1/2 | 11.4 |
| 1 | 7.0 | 5/8 | 11.4 |
| 2 | 8.1 | 3/4 | 11.4 |
| 3 | 9.3 | 6/7 | 11.4 |

From Table 1 it can be seen that the bitrate allocated to the speech encoder 12 and the rate of the channel encoder increases with the channel quality. This is possible because at better channel conditions the channel encoder can provide the required transmission quality (Frame Error Rate) using a lower bitrate. The bitrate saved by the larger rate of the channel encoder is exploited by allocating it to the speech encoder 12 in order to obtain a better speech quality. It is observed that the coding property is here the rate of the channel encoder 14. The coding property setting means 25 are arranged for setting the rate of the channel encoder 14 according to the coding property supplied by the system controller 16.

Under bad channel conditions the channel encoder needs to have a lower rate in order to be able to provide the required transmission quality. The channel encoder will be a variable rate convolutional encoder which encodes the output bits of the speech encoder 12 to which an 8 bit CRC is added. The variable rate can be obtained by using different convolutional codes having a different basic rate or by using puncturing of a convolutional code with a fixed basic rate. Preferably a combination of these methods is used.

In Table 2 presented below the properties of the convolutional codes given in Table 1 are presented. All these convolutional codes have a value v equal to 5.

TABLE 2

| | Pol/Rate | | | | | | |
|---|---|---|---|---|---|---|---|
| | 1/2 | 1/4 | 3/4 | 3/7 | 3/8 | 5/8 | 6/7 |
| $G_1 = 43$ | | | | | | | 000002 |
| $G_2 = 45$ | | | | 003 | | 00020 | |
| $G_3 = 47$ | | | 001 | | 301 | 01000 | |
| $G_4 = 51$ | | 4 | | | | 00002 | 101000 |
| $G_5 = 53$ | | | | 202 | | | |
| $G_6 = 55$ | | 3 | | | | | |
| $G_7 = 57$ | 2 | | | 020 | 230 | | |
| $G_8 = 61$ | | | 002 | | | | |
| $G_9 = 65$ | 1 | | 110 | | 022 | 02000 | 000001 |
| $G_{10} = 66$ | | | | | | | |
| $G_{11} = 67$ | | 2 | | | | | 000010 |
| $G_{12} = 71$ | | | 001 | | | | |
| $G_{13} = 73$ | | | | | 010 | | |
| $G_{14} = 75$ | | | | 110 | 100 | 10000 | 000100 |
| $G_{15} = 77$ | | 1 | | | | 00111 | 010000 |

In Table 2 the values $G_i$ represent the generator polynomials. The generator polynomials G(n) are defined according to:

$$G_i(D)=g_0\oplus g_1\cdot D\oplus\ldots\oplus g_{n-1}\cdot D^{n-1}\oplus g_n\cdot D^n \qquad (A)$$

In (1) $\oplus$ is a modulo-2 addition. i is the octal representation of the sequence $g_0, g_1, \ldots g_{v-1}, g_v$.

For each of the different codes the generator polynomials used in it, are indicated by a number in the corresponding cell. The number in the corresponding cell indicates for which of the source symbols, the corresponding generator polynomial is taken into account. Furthermore said number indicates the position of the coded symbol derived by using said polynomial in the sequence of source symbols. Each digit indicates the position in the sequence of channel symbols, of the channel symbol derived by using the indicated generator polynomial. For the rate ½ code, the generator polynomials 57 and 65 are used. For each source symbol first the channel symbol calculated according to polynomial 65 is transmitted, and secondly the channel symbol according to generator polynomial 57 is transmitted. In a similar way the polynomials to be used for determining the channel symbols for the rate ¼ code can be determined from Table 3. The other codes are punctured convolutional codes. If a digit in the table is equal to 0, it means that the corresponding generator polynomial is not used for said particular source symbol. From Table 2 can be seen that some of the generator polynomials are not used for each of the source symbols. It is observed that the sequences of numbers in the table are continued periodically for sequences of input symbols longer than 1, 3, 5 or 6 respectively.

It is observed that Table 1 gives the values of the bitrate of the speech encoder 12 and the rate of the channel encoder 14 for a full rate channel and a half rate channel. The decision about which channel is used is taken by the system operator, and is signaled to the TRAU 2, the BTS 4 and the Mobile Station 6, by means of an out of band control signal, which can be transmitted on a separate control channel. 16. To the channel encoder 14 also the signal $R_U$ is applied.

The block coder 18 is present to encode the selected rate $R_D$ for transmission to the Mobile Station 6. This rate $R_D$ is encoded in a separate encoder for two reasons. The first reason is that it is desirable to inform the channel decoder 28 in the mobile station of a new rate $R_D$ before data encoded according to said rate arrives at the channel decoder 28. A second reason is that it is desired that the value $R_D$ is better protected against transmission errors than it is possible with the channel encoder 14. To enhance the error correcting properties of the encoded $R_D$ value even more, the codewords are split in two parts which are transmitted in separate frames. This splitting of the codewords allows longer codewords to be chosen, resulting in further improved error correcting capabilities.

The block coder 18 encodes the coding property $R_D$ which is represented by two bits into an encoded coding property encoded according to a block code with codewords of 16 bits if a full rate channel is used. If a half rate channel is used, a block code with codewords of 8 bits are used to encode the coding property. The codewords used are presented below in Table 3 and Table 4.

TABLE 3

Half Rate Channel

| $R_D[1]$ | $R_D[2]$ | $C_0$ | $C_1$ | $C_2$ | $C_3$ | $C_4$ | $C_5$ | $C_6$ | $C_7$ |
|---|---|---|---|---|---|---|---|---|---|
| 0 | 0 | 0 | 0 | 0 | 0 | 0 | 0 | 0 | 0 |
| 0 | 1 | 0 | 0 | 1 | 1 | 1 | 1 | 0 | 1 |
| 1 | 0 | 1 | 1 | 0 | 1 | 0 | 0 | 1 | 1 |
| 1 | 1 | 1 | 1 | 1 | 0 | 1 | 1 | 1 | 0 |

TABLE 4

Full Rate Channel

| $R_D[1]$ | $R_D[2]$ | $C_0$ | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 1 | 1 | 1 | 1 | 0 | 1 | 0 | 0 | 1 | 1 | 1 | 1 | 0 | 1 |
| 1 | 0 | 1 | 1 | 0 | 1 | 0 | 0 | 1 | 1 | 1 | 1 | 0 | 1 | 0 | 0 | 1 | 1 |
| 1 | 1 | 1 | 1 | 1 | 0 | 1 | 1 | 1 | 0 | 1 | 1 | 1 | 0 | 1 | 1 | 1 | 0 |

From Table 3 and Table 4, it can be seen that the codewords used for a full rate channel are obtained by repeating the codewords used for a half rate channel, resulting in improved error correcting properties. In a half-rate channel, the symbols $C_0$ to $C_3$ are transmitted in a first frame, and the bits $C_4$ to $C_7$ are transmitted in a subsequent frame. In a full-rate channel, the symbols $C_0$ to $C_7$ are transmitted in a first frame, and the bits $C_8$ to $C_{15}$ are transmitted in a subsequent frame.

The outputs of the channel encoder 14 and the block encoder 18 are transmitted in time division multiplex over the air interface 10. It is however also possible to use CDMA for transmitting the several signals over the air interface 10. In the Mobile Station 6, the signal received from the air interface 10 is applied to a channel decoder 28 and to a further channel decoder being here a block decoder 26. The block decoder 26 is arranged for deriving the coding property represented by the $R_D$ bits by decoding the encoded coding property represented by codeword $C_0 \ldots C_N$, in which N is 7 for the half rate channel and N is 15 for the full rate channel.

The block decoder 26 is arranged for calculating the correlation between the four possible codewords and its input signal. This is done in two passes because the codewords are transmitted in parts in two subsequent frames. After the input signal corresponding to the first part of the codeword has been received, the correlation value between the first parts of the possible codewords and the input value are calculated and stored. When in the subsequent frame, the input signal corresponding to the second part of the codeword is received, the correlation value between the second parts of the possible codewords and the input signal are calculated and added to the previously stored correlation value, in order to obtain the final correlation values. The value of RD corresponding to the codeword having the largest correlation value with the total input signal, is selected as the received codeword representing the coding property, and is passed to the output of the block decoder 26. The output of the block decoder 26 is connected to a control input of the property setting means 27 in the channel decoder 28 and to a control input of the speech decoder 30 for setting the rate of the channel decoder 28 and the bitrate of the speech decoder 30 to a value corresponding to the signal RD.

The channel decoder 28 decodes its input signal, and presents at a first output an encoded speech signal to an input of a speech decoder 30.

The channel decoder 28 presents at a second output a signal BFI (Bad Frame Indicator) indicating an incorrect reception of a frame. This BFI signal is obtained by calculating a checksum over a part of the signal decoded by a convolutional decoder in the channel decoder 28, and by comparing the calculated checksum with the value of the checksum received from the air interface 10.

The speech decoder 30 is arranged for deriving a replica of the speech signal of the speech encoder 12 from the output signal of the channel decoder 28. In case a BFI signal is received from the channel decoder 28, the speech decoder 30 is arranged for deriving a speech signal based on the previously received parameters corresponding to the previous frame. If a plurality of subsequent frames are indicated as bad frame, the speech decoder 30 can be arranged for muting its output signal.

The channel decoder 28 provides at a third output the decoded signal $R_U$. The signal $R_U$ represents a coding property being here a bitrate setting of the uplink. Per frame the signal $R_U$ comprises 1 bit (the RQI bit ). In a deformatter 34 the two bits received in subsequent frames are combined in a bitrate setting $R_U'$ for the uplink which is represented by two bits. This bitrate setting $R_U'$ which selects one of the possibilities according to Table 1 to be used for the uplink is applied to a control input of a speech encoder 36, to a control input of a channel encoder 38, and to an input of a further channel encoder being here a block encoder 40. If the channel decoder 28 signals a bad frame by issuing a BFI signal, the decoded signal $R_U$ is not used for setting the uplink rate, because it is regarded as unreliable.

The channel decoder 28 provides at a fourth output a quality measure MMDd. This measure MMD can easily be derived when a Viterbi decoder is used in the channel decoder. This quality measure is filtered in the processing unit 32 according to a first order filter. For the output signal of the filter in the processing unit 32 can be written:

$$MMD'[n] = (1-\alpha) \cdot MMD[n] + \alpha \cdot MMD'[n-1] \qquad (B)$$

After the bitrate setting of the channel decoder 28 has been changed in response to a changed value of $R_D$, the value of MMD'[n−1] is set to a typical value corresponding to the long time average of the filtered MMD for the newly set bitrate and for a typical downlink channel quality. This is done to reduce transient phenomena when switching between different values of the bitrate.

The output signal of the filter is quantized with 2 bits to a quality indicator $Q_D$. The quality indicator $Q_D$ is applied to a second input of the channel encoder 38. The 2 bit quality indicator $Q_D$ is transmitted once each two frames using one bit position in each frame.

A speech signal applied to the speech encoder 36 in the mobile station 6 is encoded and passed to the channel encoder 38. The channel encoder 38 calculates a CRC value over its input bits, adds the CRC value to its input bits, and encodes the combination of input bits and CRC value according to the convolutional code selected by the signal $R_U'$ from Table 1.

The block encoder 40 encodes the signal $R_U'$ represented by two bits according to Table 3 or Table 4 dependent on whether a half-rate channel or a full-rate channel is used. Also here only half a codeword is transmitted in a frame.

The output signals of the channel encoder 38 and the block encoder 40 in the mobile station 6 are transmitted via the air interface 10 to the BTS 4. In the BTS 4, the block coded signal $R_U'$ is decoded by a further channel decoder being here a block decoder 42. The operation of the block decoder 42 is the same as the operation of the block decoder 26. At the output of the block decoder 42 a decoded coding property represented by a signal $R_U''$ is available. This decoded signal $R_U''$ is applied to a control input of coding property setting means in a channel decoder 44 and is passed, via the A-bis interface, to a control input of a speech decoder 48.

In the BTS 4, the signals from the channel encoder 38, received via the air interface 10, are applied to the channel decoder 44. The channel decoder 44 decodes its input signals, and passes the decoded signals via the A-bis interface 8 to the TRAU 2. The channel decoder 44 provides a quality measure MMDu representing the transmission quality of the uplink to a processing unit 46. The processing unit 46 performs a filter operation similar to that performed in the processing unit 32 and 22. Subsequently the result of the filter operation is quantized in two bits and transmitted via the A-bis interface 8 to the TRAU 2.

In the system controller 16, a decision unit 20 determines the bitrate setting $R_U$ to be used for the uplink from the quality measure $Q_U$. Under normal circumstances, the part of the channel capacity allocated to the speech coder will increase with increasing channel quality. The rate $R_U$ is transmitted once per two frames.

The signal $Q_D'$ received from the channel decoder 44 is passed to a processing unit 22 in the system controller 16. In the processing unit 22, the bits representing $Q_D'$ received in two subsequent frames are assembled, and the signal $Q_D'$ is filtered by a first order low-pass filter, having similar properties as the low pass filter in the processing unit 32.

The filtered signal $Q_D'$ is compared with two threshold values which depend on the actual value of the downlink rate $R_D$. If the filtered signal $Q_D'$ falls below the lowest of said threshold value, the signal quality is too low for the rate $R_D$, and the processing unit switches to a rate which is one step lower than the present rate. If the filtered signal $Q_D'$ exceeds the highest of said threshold values, the signal quality is too high for the rate $R_D$, and the processing unit switches to a rate which is one step higher than the present rate. The decision taking about the uplink rate $R_U$ is similar as the decision taking about the downlink rate $R_D$.

Again, under normal circumstances, the part of the channel capacity allocated to the speech coder will increase with increasing channel quality. Under special circumstances the signal $R_D$ can also be used to transmit a reconfiguration signal to the mobile station. This reconfiguration signal can e.g. indicate that a different speech encoding/decoding and or channel coding/decoding algorithm should be used. This reconfiguration signal can be encoded using a special predetermined sequence of $R_D$ signals. This special predetermined sequence of $R_D$ signals is recognised by an escape sequence decoder 31 in the mobile station, which is arranged for issuing a reconfiguration signal to the effected devices when a predetermined (escape) sequence has been detected. The escape sequence decoder 31 can comprise a shift register in which subsequent values of $R_D$ are clocked. By comparing the content of the shift register with the predetermined sequences, it can easily be detected when an escape sequence is received, and which of the possible escape sequences is received.

An output signal of the channel decoder 44, representing the encoded speech signal, is transmitted via the A-Bis interface to the TRAU 2. In the TRAU 2, the encoded speech signal is applied to the speech decoder 48. A signal BFI at the output of the channel decoder 44, indicating the detecting of a CRC error, is passed to the speech decoder 48 via the A-Bis interface 8. The speech decoder 48 is arranged for deriving a replica of the speech signal of the speech encoder 36 from the output signal of the channel decoder 44. In case a BFI signal is received from the channel decoder 44, the speech decoder 48 is arranged for deriving a speech signal based on the previously received signal corresponding to the previous frame, in the same way as is done by the speech decoder 30. If a plurality of subsequent frames are indicated as bad frame, the speech decoder 48 can be arranged for performing more advanced error concealment procedures.

Figure 2:
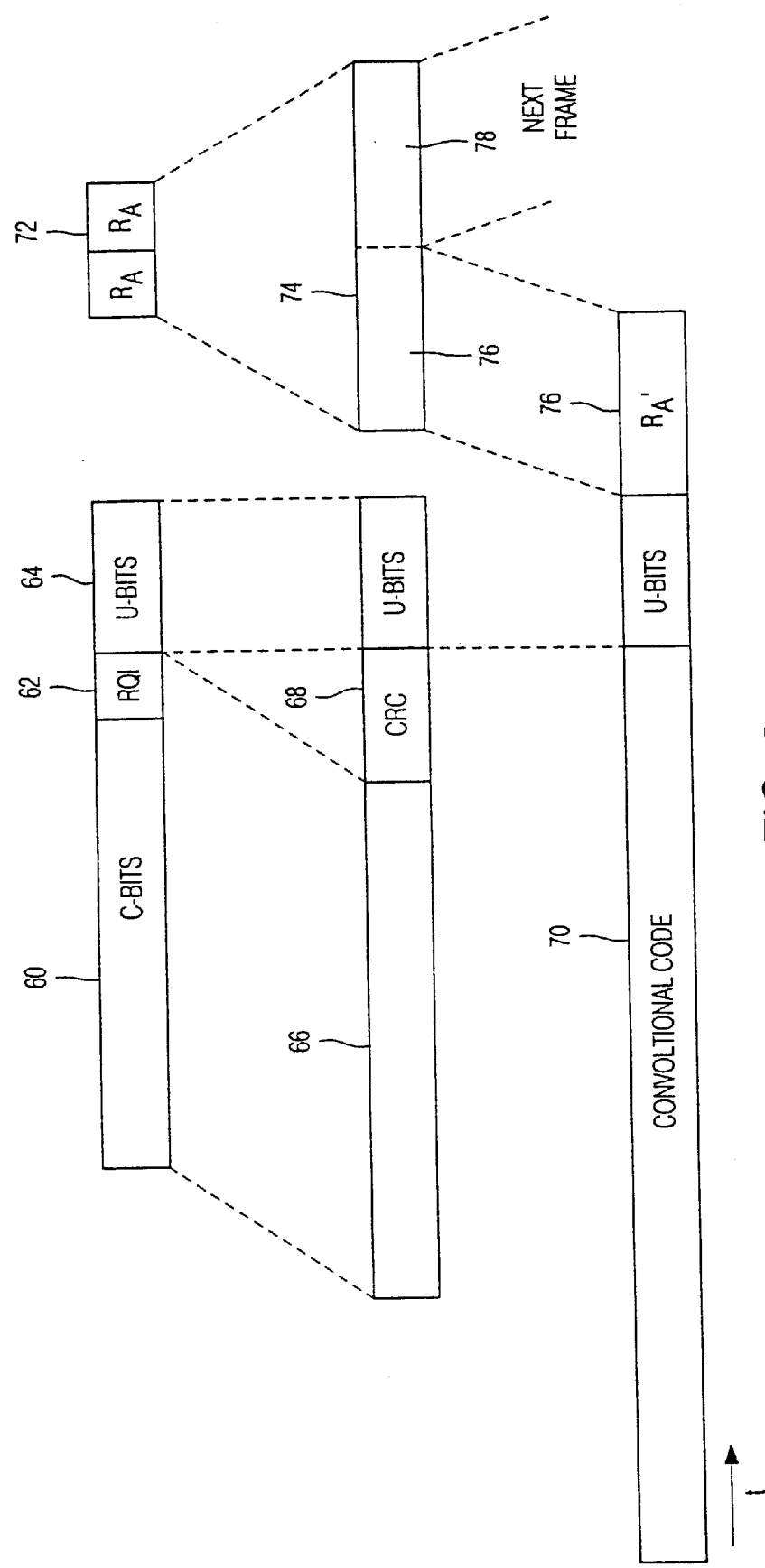
FIG. 2 shows a frame structure use in the transmission system according to FIG. 1.

FIG. 2 shows the frame format used in a transmission system according to the invention. The speech encoder 12 or 36 provides a group 60 of C-bits which should be protected against transmission errors, and a group 64 of U-bits which do not have to be protected against transmission errors. The further sequence comprises the U-bits. The decision unit 20 and the processing unit 32 provide one bit RQI 62 per frame for signalling purposes as explained above.

The above combination of bits is applied to the channel encoder 14 or 38 which first calculates a CRC over the combination of the RQI bit and the C-bits, and appends 8 CRC bits behind the C-bits 60 and the RQI bit 62. The U-bits are not involved with the calculation of the CRC bits. The combination 66 of the C-bits 60 and the RQI bit 62 and the CRC bits 68 are encoded according to a convolutional code into a coded sequence 70. The encoded symbols comprise the coded sequence 70. The U-bits remain unchanged.

The number of bits in the combination 66 depends on the rate of the convolutional encoder and the type of channel used, as is presented below in Table 5.

TABLE 5

|  | # bits/rate | | | | | | |
|---|---|---|---|---|---|---|---|
|  | 1/2 | 1/4 | 3/4 | 3/7 | 3/8 | 5/8 | 6/7 |
| Full rate | 217 | 109 |  | 189 | 165 |  |  |
| Half rate | 105 |  | 159 |  |  | 125 | 174 |

The two $R_A$ bits 72 which represent the coding property are encoded in codewords 74, which represent the encoded coding property, according the code displayed in Table 3 or 4, dependent on the available transmission capacity (half rate or full rate). This encoding is only performed once in two frames. The codewords 74 are split in two parts 76 and 78 and transmitted in the present frame and the subsequent frame.

What is claimed is:

1. Transmission system comprising a transmitter for transmitting a main signal and an auxiliary signal via a transmission channel to a receiver, said transmitter being arranged for receiving the main signal and the auxiliary signal, wherein the transmitter comprises an encoder for encoding the main signal in a way described by a coding property, and the receiver comprises a decoder for decoding the main signal in a way described by the coding property, the transmitter including coding property sequencing means for changing the coding.property according to a predetermined sequence dependent on the auxiliary signal, and the receiver including a sequence detector for detecting said predetermined sequence in the coding property, wherein the coding property is exchanged in two frames including a first frame having a first part of the coding property and a second frame having a second part of the coding property.

2. The transmission system of claim 1, wherein said first frame and said second frame are successive frames.

3. The transmission system according to claim 1, further comprising transmission quality determining means for determining a transmission quality of the transmission channel, and adaptation means for adapting the coding property in dependence on the transmission quality, wherein the coding property sequencing means are arranged for changing the coding property only to values corresponding to a lower transmission quality than the transmission quality determined by the transmission quality determining means.

4. Transmitter being arranged for transmitting a main signal and an auxiliary signal, the transmitter comprising an encoder for encoding the main signal in a way described by a coding property, coding property sequencing means for changing the coding property according to a predetermined sequence dependent on the auxiliary signal, wherein the sequence detection means is configured to transmit the coding property in two frames including a first frame having a first part of the coding property and a second frame having a second part of the coding property.

5. The transmitter of claim 4, wherein said first frame and said second frame are successive frames.

6. Receiver being arranged for receiving a main signal and an auxiliary signal, the receiver comprising a decoder for decoding the main signal in a way described by a coding property, and sequence detection means for detecting predetermined sequences in the coding property for receiving the auxiliary signal, wherein the sequence detection means is configured to receive the coding property in two frames including a first frame having a first part of the coding property and a second frame having a second part of the coding property.

7. The receiver of claim 6, wherein said first frame and said second frame are successive frames.

8. Method for transmitting a main signal and an auxiliary signal to a receiver, which is arranged for receiving the main signal and the auxiliary signal, the method comprising:

encoding the main signal in a way described by a coding property, decoding the main signal in a way described by the coding property, changing the coding property according to a predetermined sequence dependent on the auxiliary signal, and detecting said predetermined sequence in the coding property, wherein the coding property is exchanged in two frames including a first frame having a first part of the coding property and a second frame having a second part of the coding property.

9. The method of claim 8, wherein said first frame and said second frame are successive frames.

10. Method for transmitting a main signal and an auxiliary signal, the method comprising:

encoding the main signal in a way described by a coding property, and changing the coding property according to a predetermined sequence dependent on the auxiliary signal, wherein the coding property is exchanged in two frames including a first frame having a first part of the coding property and a second frame having a second part of the coding property.

11. The method of claim 10, wherein said first frame and said second frame are successive frames.

12. Method for receiving a main signal and an auxiliary signal, the method comprising:

decoding the main signal in a way described by a coding property, and detecting predetermined sequences in the coding property for receiving the auxiliary signal, wherein the coding property is exchanged in two frames including a first frame having a first part of the coding property and a second frame having a second part of the coding property.

13. The method of claim 12, wherein said first frame and said second frame are successive frames.

14. Signal comprising a main signal component and an auxiliary signal component, wherein the main signal component is encoded according to a coding property, and the coding property changes according to predetermined sequences in order to carry the auxiliary component, wherein the coding property is exchanged in two frames including a first frame having a first part of the coding property and a second frame having a second part of the coding property.

15. The signal of claim 14, wherein said first frame and said second frame are successive frames.

16. A transmission system comprising:

a receiver; and a transmitter for transmitting a main signal and an auxiliary signal via a transmission channel to said receiver;

said transmitter including a main encoder for encoding the main signal in a way described by a coding property, and a code encoder for encoding the coding property; and said receiver including a main decoder for decoding the main signal in a way described by the coding property, and a code decoder for decoding the coding property.

17. The transmission system of claim 16, wherein said code encoder and said code decoder are configured to exchange said coding property before said main signal having said coding property arrives to said main decoder.

18. The transmission system of claim 16, wherein the transmitter includes coding property sequencing means for changing the coding property according to a predetermined sequence dependent on the auxiliary signal, and the receiver includes a sequence detector for detecting said predetermined sequence in the coding property.

19. The transmission system of claim 16, wherein the coding property is exchanged in two frames including a first frame having a first part of the coding property and a second frame having a second part of the coding property.

20. The transmission system of claim 19, wherein said first frame and said second frame are successive frames.

* * * * *